United States Patent [19]
Wu et al.

[11] Patent Number: 5,982,017
[45] Date of Patent: Nov. 9, 1999

[54] RECESSED STRUCTURE FOR SHALLOW TRENCH ISOLATION AND SALICIDE PROCESSES

[75] Inventors: Sheng-Jyh Wu; Jing-Meng Liu, both of Hsin-Chu; Chao-Chieh Tsai, Taichung, all of Taiwan

[73] Assignee: Taiwan Semiconductor Manufacturing Company, Hsin-Chu, Taiwan

[21] Appl. No.: 09/253,293

[22] Filed: Feb. 19, 1999

Related U.S. Application Data

[62] Division of application No. 08/995,339, Dec. 22, 1997, Pat. No. 5,891,771.

[51] Int. Cl.$^6$ .................... H01L 29/772; H01L 31/0352; H01L 27/105
[52] U.S. Cl. .................. 257/513; 257/510; 257/515; 257/374; 257/754
[58] Field of Search .................... 257/513, 510, 257/374, 515, 754

[56] References Cited

U.S. PATENT DOCUMENTS

| | | | |
|---|---|---|---|
| 4,561,172 | 12/1985 | Slawinski | 257/510 |
| 4,635,090 | 1/1987 | Tamaki et al. | 357/50 |
| 4,916,511 | 4/1990 | Douglas | 357/23.6 |
| 5,424,232 | 6/1995 | Yamauchi | 437/43 |
| 5,675,176 | 10/1997 | Ushiku | 257/513 |
| 5,777,370 | 7/1998 | Omid-Zohoor | 257/510 |
| 5,866,934 | 2/1999 | Kadosh | 257/374 |
| 5,895,253 | 4/1999 | Akram | 257/374 |

*Primary Examiner*—Jerome Jackson, Jr.
*Attorney, Agent, or Firm*—George O. Saile; Stephen B. Ackerman

[57] ABSTRACT

A shallow trench isolated FET LDD structure that has a low probability of short circuiting at the silicon to trench interface or between the source or drain and the gate (because of a titanium silicide bridge) is described. It is based on an isolation trench having a top portion with vertical sides and a lower portion with sloping sides. With the filled trench in place, along with a polysilicon gate and gate oxide, the thinner, lightly doped, N type layer is formed using ion implantation. Spacers are then formed on the gate but, prior to the second ion implant step, a few hundred Angstroms of silicon is selectively removed from the surface. This causes the trench filler material to extend above the wafer surface and the spacers to extend above the gate. A deeper, more strongly N-type, layer is then formed in the usual way, followed by the standard SALICIDE process for making contact to source, gate, and drain.

5 Claims, 2 Drawing Sheets

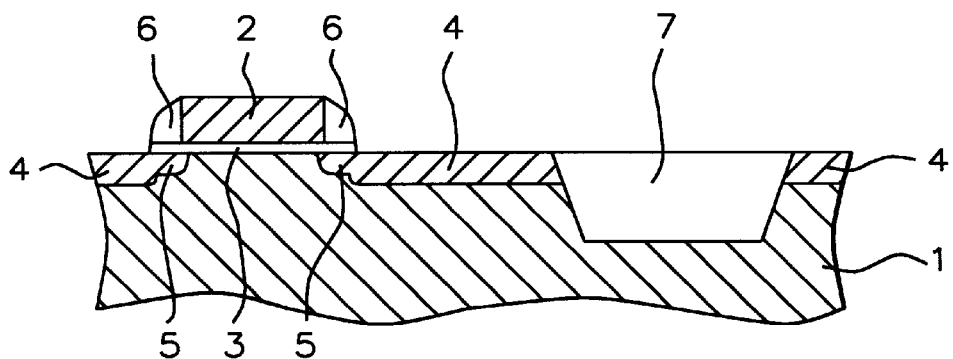
FIG. 1 — Prior Art
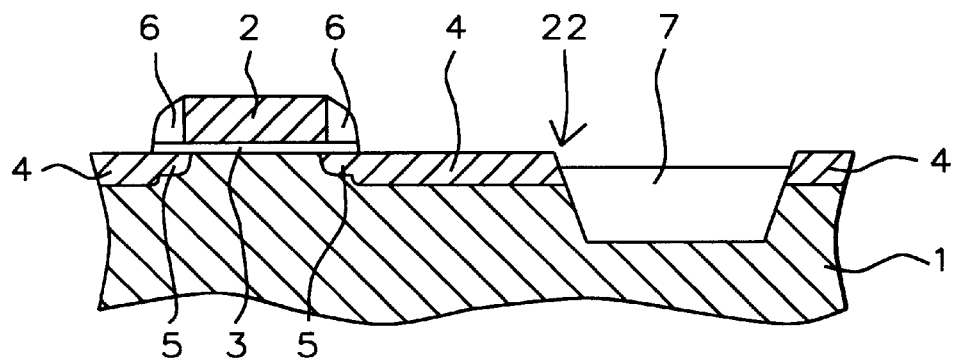
FIG. 2 — Prior Art
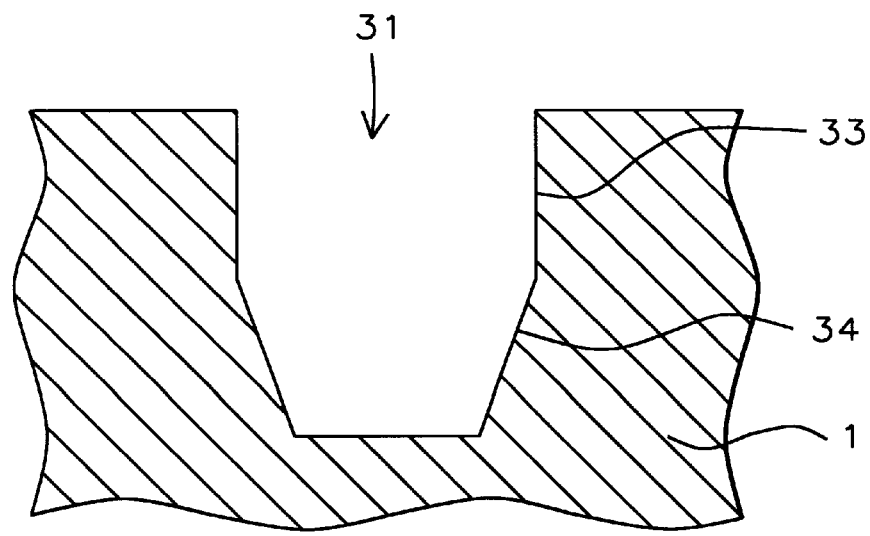
FIG. 3

RECESSED STRUCTURE FOR SHALLOW TRENCH ISOLATION AND SALICIDE PROCESSES

This is a division of patent applicaton Ser. No. 08/995,339, filing date Dec. 22, 1997, Recessed Structure For Shallow Trench Isolation And Salicide Processes, assigned to the same assignee as the present invention.

FIELD OF THE INVENTION

The invention relates to the general field of integrated circuits with particular reference to avoidance of electrical shorts resulting from interaction between the STI and SALICIDE processes.

BACKGROUND OF THE INVENTION

In FIG. 1 we show a schematic view of a Field Effect Transistor (FET) of the Lightly Doped Drain (LDD) type. Polysilicon gate 2 lies on P-type silicon substrate 1 with gate insulation layer 3 between them. The gate is used to control current flow between the two N-type regions 4 one of which serves as a source while the other serves as a drain. To improve performance of the device, region 4 does not interface directly with P material 1 under the gate. Instead 4 connects to region 5 which is both thinner and more lightly doped than region 4.

To make this structure, region 5 is formed first by ion implantation, using gate 2 as a mask. Then, dielectric spacers 6 are formed on the vertical sidewalls of 2 and region 4 is formed using a second ion implantation, with the spacers now serving as the mask.

It is also necessary to electrically isolate the device from other electrical components on the same P substrate. This is often done by means of shallow trench isolation (STI). Trench 7 having gently sloping walls (at a typical angle of about 80 degrees from the vertical) is formed using standard etching techniques and then back filled with a dielectric material (usually silicon oxide).

To make electrical contact to the source, gate, and drain regions, the Self Aligned Silicide (SALICIDE) process is used. A layer of metal such as titanium is deposited over all surfaces and then given a brief, but intense, heat treatment or Rapid Thermal Anneal (RTA) which is sufficient to cause the titanium to react with all silicon surfaces with which it is in contact, thereby getting converted to titanium silicide. The titanium does not react with any of the non-silicon surfaces that it contacts such as the spacers and the shallow isolation trench. Thus, following the RTA, a selective etch may be used to remove all unreacted titanium while leaving behind the titanium silicide. The latter is a good electrical conductor so the net result is separate contacts to the source and drain, separated from the gate contact by the spacers. Similarly, no titanium silicide will form on the top surface of the isolation trench 7 so it continues to function in this capacity.

As part of subsequent processing, it is often necessary to lay down a thin (about 350 Angstrom) oxide layer on the structure of FIG. 1 followed by a removal etch. For example, I/O circuitry present elsewhere on the surface (not shown) need to be protected by a layer of oxide prior to titanium deposition in order to improve ESD performance. This resist protection oxide (RPO) is formed by protecting the appropriate area with photoresist and then etching unprotected areas in the usual way. This results in the removal of about 350–400 Angstroms of any unprotected oxide, including the surface of the oxide that was used to fill trench 7. Also, it is often necessary to remove native oxide (or even all remaining oxide) prior to the formation of silicide surfaces. A 'pre-Ti sputter' etch (usually HF solution) is normally performed. This results in the removal of 50–100 Angstroms of the oxide that was used to fill trench 7.

The appearance of the structure of FIG. 1 after RPO etch and 'pre-Ti sputter' etch is shown in FIG. 2. As shown, the top surface of the trench filler oxide material has now dropped below the top surface of layer 4 that is adjacent to it. The step in the surface that is formed as a result of this has an exposed vertical edge that is pointed to by arrow 22. Bearing in mind that, during the SALICIDE step that follows, titanium silicide will form on the newly exposed vertical edge 22, it is apparent that only a very thin layer of N-type silicon in region 4 remains between titanium silicide that forms on 22 and P-type silicon region 1. Thus the possibility that source/drain region 4 may short to the main substrate is increased substantially.

Another possible source of shorting via a titanium silicide bridge is also present. In this case, the short is between the source and the gate or between the drain and the gate. It will occur if a small amount of titanium silicide is formed on either of the spacers as a result of some diffusion of silicon to the surface of the spacer during the RTA. The present invention seeks to provide a process and structure that eliminates both type of short.

Prior art that we have come across and that may have some bearing on the present invention includes Yamauchi (U.S. Pat. No. 5,424,232 June 1995) who describes a non-volatile memory based on a floating gate. Part of the structure that is shown by Yamauchi includes silicon nitride spacers on the vertical sides of the floating gate, said spacers extending upwards to some point that is higher than the gate.

Douglas (U.S. Pat. No. 4,916,511 April 1990) teaches a method for etching a deep trench in silicon for use in a capacitor structure having positively sloped, but steep, sidewalls and a flat bottom.

Tamaki et al. (U.S. Pat. No. 4,635,090 January 1987) show how to make a trench having walls that are vertical for their lower half and positively sloping for the upper half.

SUMMARY OF THE INVENTION

It has been an object of the present invention to provide an FET LDD structure that has a low probability of short circuiting between the N layer and the P substrate at the silicon to trench interface.

Another object of the invention is that said structure also have a low probability of a short circuit between the source or drain and the gate, via a titanium silicide bridge on a spacer.

Yet another object has been to provide a method for manufacturing this structure.

A further object has been that said method yield a product that is no more expensive than, and has comparable performance to, conventionally manufactured products.

These objects have been achieved by using an isolation trench having a top portion with vertical sides and a lower portion with sloping sides. With the filled trench in place, along with a polysilicon gate and gate oxide, the thinner, lightly doped, N type layer is formed using ion implantation in the usual way. Spacers are then formed on the gate but, prior to the second ion implant step, a few hundred Angstroms of silicon is selectively removed from the surface. This causes the trench filler material to extend above the wafer surface and the spacers to extend above the gate by this amount. A deeper, more strongly N-type, layer is then formed in the usual way, followed by the standard SALICIDE process for making separate contacts to source, gate, and drain.

BRIEF DESCRIPTION OF THE DRAWINGS

FIG. 1 shows an LDD FET structure of the prior art, including a shallow trench for isolation.

FIG. 2 illustrates how, after RPO removal and etching prior to Ti sputtering, the source/gate extend above the isolation trench, introducing the possibility of a junction short by a titanium silicide bridge.

FIG. 3 illustrates the cross-sectional shape of the isolation trench that is part of the present invention.

DESCRIPTION OF THE PREFERRED EMBODIMENTS

Figure 4:
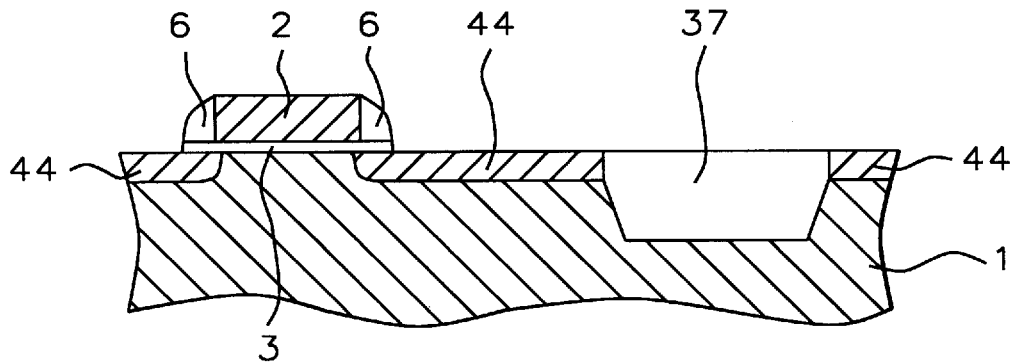
FIGS. 4–6 illustrate successive steps of the process of the present invention.

We will provide a description of how to manufacture a product that has the same device characteristics as that shown in FIG. 1. As we proceed, the structure of this product will become evident. The process begins, as before, with the provision of P-type silicon substrate 1. The first departure from prior art practice is seen in the shape of the trench that will be used to achieve STI.

Referring now to FIG. 3, arrow 31 points to this trench which can be seen to have an upper portion 33 that has vertical sidewalls and a lower portion 34 that has sloping walls. The reasons for choosing this shape will become apparent below but it should be remembered that FIG. 3 has not been drawn to scale. In order to be able to produce such a shape a smaller trench, having vertical side walls 33, is first formed using an anisotropic etch at between about 85 and 90° C. This is followed by a 'tapered' anisotropic etch at between about 75 and 80° C. The completed trench has sloping walls 34 for its lower part.

Once completed, the trench is filled with a dielectric material, typically silicon oxide. In practice, the trench is overfilled and then planarized so that the filler oxide comes level with the surface of 1.

Referring now to FIG. 4, the next step is to form the gate. This is done by first forming a layer of thermal oxide 3, between about 40 and 60 Angstroms thick, on the surface of the P-type silicon substrate, followed by the deposition of a layer of polysilicon between about 2,000 and 2,500 Anqstroms thick which is patterned and etched into the shape of the gate 2. The implantation of N-type dopant ions, such as arsenic or phosphorus, comes next. The gate 2 (without spacers being in place yet) serves as the mask during the ion implant. The result is formation of layer 44 which has a thickness between about 800 and 1,000 Angstroms. It is N-type but is lightly doped, the ion dosage at the completion of the implant being between about $4\times10^{14}$ and $6\times10^{14}$ per sq. cm.

Once dielectric spacers 6 have been formed on the vertical sides of the gate electrode 2, the structure has the appearance shown in FIG. 4.

Figure 5:
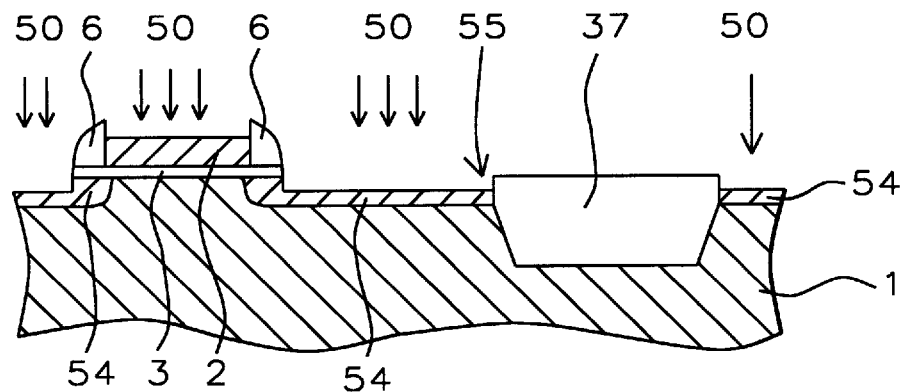

We refer now to FIG. 5. In a departure from normal practice, an additional etching step is introduced at this time. This is a self-aligned etching procedure that attacks only horizontal silicon surfaces. For this purpose we have used a chlorine/hydrogen bromide based etch for between about 1 and 2 minutes which results in the removal of between about 300 and 500 Angstroms of silicon.

The result of the selective silicon removal is that filler material from trench 37 now extends above the surface of the main silicon substrate by between about 300 and 500 Angstroms, as pointed to by arrow 55, and spacers 6 are now seen to extend above gate 2 by between about 300 and 500 Angstroms. Note, too, that lightly doped N-type layer 54 (designated 44 prior to the selective silicon etch) is now between about 500 and 700 Angstroms thick. Finally, the structure illustrated in FIG. 5 is subjected to implantation of N-type dopant ions, such as arsenic or phosphorus, as symbolized by arrows 50.

Figure 6:
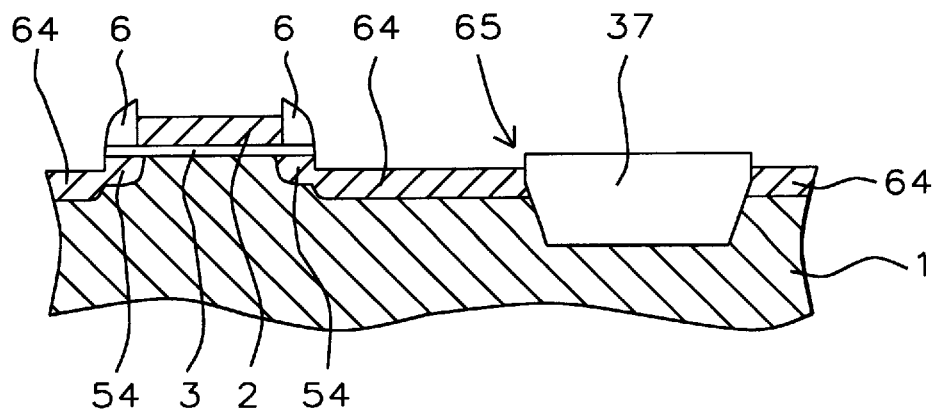

Referring now to FIG. 6, the result of the ion implant is formation of layer 64 which has a thickness between about 1,200 and 1,500 Angstroms. It is heavily doped relative to layer 54, the ion dosage at the completion of the implant being between about $4\times10^{15}$ and $6\times10^{15}$ per cm.$^2$, corresponding to sheet resistance of between about 50 and 100 ohms per square. Once this structure is used, rather than the prior art version shown in FIG. 2, removal of the RPO, as well as etching prior to Ti sputtering, can now take place without introducing the danger of a possible short between N+ layer 64 and P layer 1 because, as pointed to by arrow 65, the surface of filler oxide 37 has not dropped below the top surface of 64 so no vertical sides for 64, on which titanium silicide might grow, have been formed.

As in the prior art, selective connection to the source, drain, and gate regions can now be made, using the SALICIDE process, enabling manufacture of the structure to be completed While the invention has been particularly shown and described with reference to the preferred embodiments thereof, it will be understood by those skilled in the art that various changes in form and details, including reversal of silicon types, may be made without departing from the spirit and scope of the invention.

What is claimed is:

1. A semiconductor device structure comprising:

a body of P-type silicon having an upper surface;

a shallow isolation trench having an upper wall of a first depth, a lower wall of a second depth, and a flat bottom, the upper wall being vertical and the lower wall sloping inwards at an angle towards said bottom;

filler material that fills the trench and extends an amount above said upper surface;

a polysilicon gate, on a layer of gate insulation on said upper surface, having a top surface and, on its vertical sides, dielectric spacers that extend said amount above said top surface;

a first layer of N-type silicon, under the spacers, having a first thickness and a first dopant concentration; and a second layer of N-type silicon, in said upper surface, having a second thickness that is greater than said first thickness and a second dopant concentration that is greater than said first dopant concentration.

2. The structure of claim 1 wherein said angle is between about 75 and 80 degrees.

3. The structure of claim 1 wherein the amount that the filler material extends above the upper surface is between about 300 and 500 Angstroms.

4. The structure of claim 1 wherein the depth of the upper vertical wall is between about 500 and 800 Angstroms.

5. The structure of claim 1 wherein the depth of the lower sloping wall is between about 4,000 and 6,000 Angstroms.

* * * * *